(12) United States Patent
Rosen et al.

(10) Patent No.: US 10,598,750 B2
(45) Date of Patent: Mar. 24, 2020

(54) 3D BALANCED EPI MAGNETIC RESONANCE FINGERPRINTING

(71) Applicant: The General Hospital Corporation, Boston, MA (US)

(72) Inventors: Matthew S. Rosen, Somerville, MA (US); Mathieu Sarracanie, Somerville, MA (US); Ouri Cohen, Teaneck, NJ (US)

(73) Assignee: The General Hospital Corporation, Boston, MA (US)

( * ) Notice: Subject to any disclaimer, the term of this patent is extended or adjusted under 35 U.S.C. 154(b) by 606 days.

(21) Appl. No.: 15/088,353

(22) Filed: Apr. 1, 2016

(65) Prior Publication Data

US 2016/0291107 A1   Oct. 6, 2016

Related U.S. Application Data

(60) Provisional application No. 62/142,049, filed on Apr. 2, 2015.

(51) Int. Cl.
| | | |
|---|---|---|
| *G01R 33/54* | (2006.01) | |
| *G01R 33/50* | (2006.01) | |
| *G01R 33/561* | (2006.01) | |
| *G01R 33/483* | (2006.01) | |

(52) U.S. Cl.
CPC ........... *G01R 33/543* (2013.01); *G01R 33/50* (2013.01); *G01R 33/4835* (2013.01); *G01R 33/5614* (2013.01); *G01R 33/5616* (2013.01)

(58) Field of Classification Search
CPC ........ G01R 33/48; G01R 33/50; G01R 33/54; G01R 33/543; G01R 33/561; G01R 33/5612; G01R 33/5613; G01R 33/5616; G01R 33/5614; G01R 33/482; G01R 33/4828; G01R 33/483; G01R 33/4835
See application file for complete search history.

(56) References Cited

U.S. PATENT DOCUMENTS 5,212,448 A * 5/1993 Le Roux ............... G01R 33/446
                                                            324/307
5,621,321 A * 4/1997 Liu ................... G01R 33/56554
                                                            324/307

(Continued)

*Primary Examiner* — Son T Le
(74) *Attorney, Agent, or Firm* — Quarles & Brady LLP (57) ABSTRACT

Provided is a system and method for performing a magnetic resonance fingerprinting imaging process. The process includes determining acquisition parameters including at least one of repetition time (TR) or flip angle (FA), selected to control one of a duration and a number of repetitions of for a pulse sequence that samples k-space in a Cartesian acquisition pattern by acquiring an echo train. The process also includes controlling a magnetic resonance imaging (MRI) system to perform the pulse sequence a plurality of times to acquire magnetic resonance fingerprinting (MRF) data corresponding to signals from the subject excited by the pulse sequence. The process also includes estimating quantitative tissue properties of the subject by comparing the MRF data to a database and reconstructing, from the MRF data, at least one image of the subject indicating the estimated quantitative tissue properties.

21 Claims, 7 Drawing Sheets
(4 of 7 Drawing Sheet(s) Filed in Color)

(56) References Cited

U.S. PATENT DOCUMENTS

| | | | | |
|---|---|---|---|---|
| 7,164,268 B2 * | 1/2007 | Mugler, III | ........ | G01R 33/5615 324/307 |
| 2010/0261993 A1 * | 10/2010 | van der Kouwe | ........................... | G01R 33/4816 600/410 |
| 2014/0012129 A1 * | 1/2014 | Lohman | ............. | G01R 33/5601 600/420 |
| 2015/0177350 A1 * | 6/2015 | Warntjes | ................ | G01R 33/50 324/309 |
| 2015/0346300 A1 * | 12/2015 | Setsompop | ........ | G01R 33/4828 324/309 |
| 2015/0369891 A1 * | 12/2015 | Miyazaki | ........... | G01R 33/5617 324/309 |
| 2016/0155238 A1 * | 6/2016 | Bachschmidt | ............ | G06T 7/11 382/131 |
| 2017/0315193 A1 * | 11/2017 | Amthor | .................. | A61B 5/055 |

\* cited by examiner

3D BALANCED EPI MAGNETIC RESONANCE FINGERPRINTING

CROSS-REFERENCE TO RELATED APPLICATIONS

This application is based on, claims priority to, and incorporates herein by reference in its entirety, U.S. Provisional Application Ser. No. 62/142,049, filed Apr. 2, 2015, and entitled "3D BALANCED EPI MAGNETIC RESONANCE FINGERPRINTING."

STATEMENT REGARDING FEDERALLY SPONSORED RESEARCH

This invention was made with government support under W81XWH-11-2-076 awarded by the Department of Defense. The government has certain rights in the invention.

BACKGROUND

The present disclosure relates to systems and methods for magnetic resonance imaging ("MRI"). More particularly, the disclosure relates to systems and methods for accelerating data acquisitions used in magnetic resonance fingerprinting applications.

Magnetic resonance fingerprinting ("MRF") is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

Often, a slice-selective, highly undersampled spiral k-space acquisition is utilized for two-dimensional MRF acquisitions, where in many instances, the spiral trajectory is changed from one time point (e.g., TR period) to the next. To enable accurate parameter estimation, for each imaging slice upwards of 1000-2000 time points are acquired with a TR that is typically about 10 milliseconds. This results in an acquisition time of around 10-20 seconds per imaging slice. To create high-resolution volumetric parameter maps with 1 mm slice thickness, approximately 120 imaging slices will have to be imaged, resulting in a total acquisition time of 20-40 minutes. This acquisition time is quite lengthy and limits the widespread clinical usage of MRF techniques.

In addition to lengthy acquisition time, MRF using a spiral k-space trajectory requires a complicated algorithm for image reconstruction and is not available on many clinical systems. Even when supported, the resulting images are plagued by imaging artifacts. Further, the resulting images do not provide quantitative information about the patient, which is an increasingly desired feature in clinical settings.

Ultra-low-field imaging (ULF) is an MRI variation born from the need to reduce the high-cost (e.g., $1,000,000 per tesla (T) of magnetic field) and scanner sitting requirements of traditional MRI. ULF provides a more affordable (<$50,000) option for smaller clinics and robust portable devices for hospital emergency departments. Unfortunately, however, the images produced from this technology provide limited 3D coverage and suffer from low signal to noise ratio (SNR) and poor resolution, limiting their use as a diagnostic tool. In addition, ULF MRI suffers from intrinsically long acquisition times, most of which is incompressible, that result from the time needed to generate nuclear polarization using smaller magnetic fields.

Thus, it would be desirable to provide a system and methods for magnetic resonance fingerprinting that is simple and robust, uses an optimized k-space trajectory, and produces 3D images.

SUMMARY OF THE INVENTION

The present disclosure overcomes the aforementioned drawbacks by providing systems and methods for performing a medical imaging process, which include estimating a set of acquisition parameters that are selected to provide quantitative information about a subject in a desired amount of time. The process can include directing a magnetic resonance imaging (MRI) system to acquire 3-dimensional (3D) data from the subject by performing a pulse sequence using the desired acquisition parameters for a multi-echo, Cartesian-sampling. Quantitative tissue properties of the subject are then estimated by comparing the acquired 3D data to a database. An image of the subject is then generated which maps the quantitative tissue properties.

In accordance with one aspect of the disclosure, a method is provided for acquiring magnetic resonance fingerprinting (MRF) data from a subject using a magnetic resonance imaging (MRI) system. The method including steps of a) selecting a pulse sequence to perform that samples k-space in a Cartesian acquisition pattern by acquiring an echo train and b) determining acquisition parameters for the pulse sequence, including at least one of repetition time (TR) or flip angle (FA), selected to control one of a duration and a number of repetitions of the pulse sequence. The method also includes c) directing a magnetic resonance imaging (MRI) system to acquire 3-dimensional (3D) magnetic resonance fingerprinting (MRF) data from the subject by performing the pulse sequence and d) directing the MRI system to repeat step c) using varied scan parameters to acquire sets of the 3D MRF data using differing scan parameters, e) estimating quantitative tissue properties of the subject by comparing the sets of the 3D MRF data using differing scan parameters to a database, and f) generate at least one image of the subject indicating the quantitative tissue properties.

In accordance with another aspect of the disclosure, a magnetic resonance imaging (MRI) system is provided that includes a magnet system configured to generate a static magnetic field about at least a volume of interest (VOI) of a subject arranged in the MRI system and at least one gradient coil configured to establish at least one magnetic gradient field with respect to the static magnetic field. The MRI system also includes a radio frequency (RF) system configured to deliver excitation pulses to a subject and a computer system. The computer system is programmed to determine acquisition parameters including at least one of repetition time (TR) or flip angle (FA), selected to control one of a duration and a number of repetitions of for a pulse sequence that samples k-space in a Cartesian acquisition pattern by acquiring an echo train. The computer system is also programmed to control the at least one gradient coil and the RF system to perform the pulse sequence a plurality of times and acquire magnetic resonance fingerprinting (MRF) data corresponding to signals from the subject excited by the pulse sequence. The computer system is further programmed to estimate quantitative tissue properties of the subject by comparing the MRF data to a database and reconstruct, from the MRF data, at least one image of the subject indicating the estimated quantitative tissue properties.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

Described here are systems and methods for implementing Magnetic Resonance Fingerprinting (MRF) using an optimized, fully-refocused 3D balanced-EPI (b-EPI) pulse sequence. The systems and methods may also include implementing pulse sequences that rapidly acquire large volumes of k-space data, including echo-planar imaging ("EPI") and segmented EPI sequences.

Figure 1:
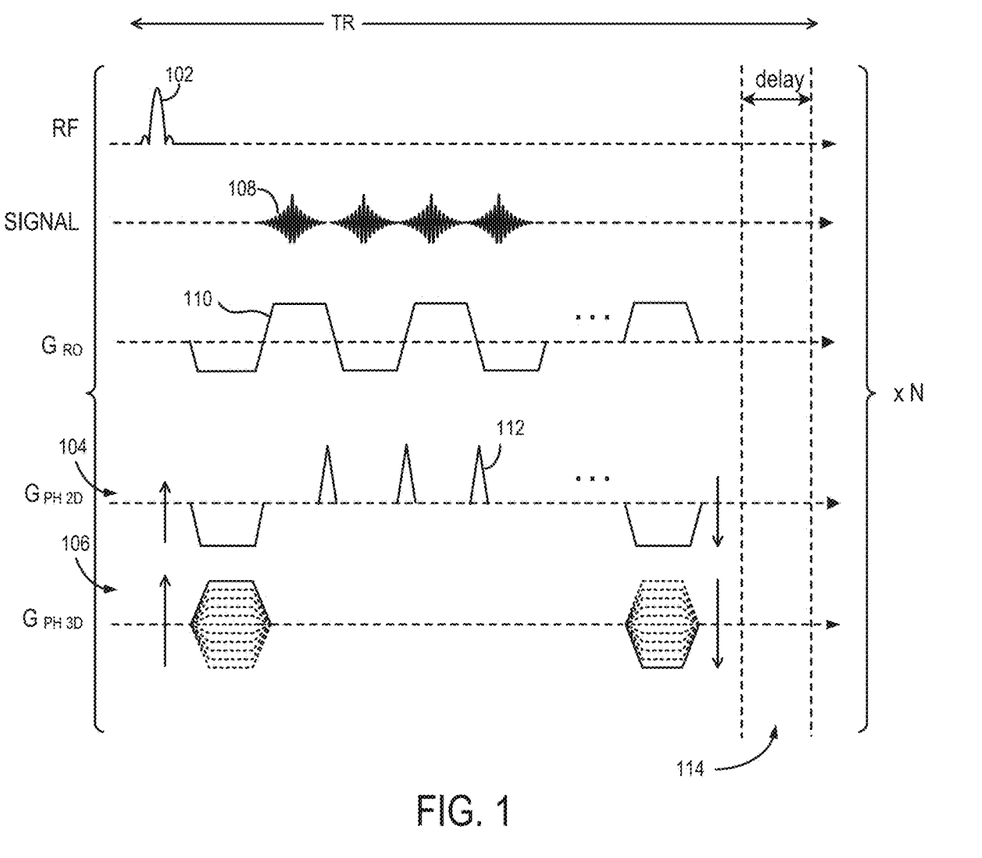
FIG. 1 is an example of an echo-planar imaging ("EPI") pulse sequence which may be used in accordance with the present disclosure.

Referring specifically now to FIG. 1, an example pulse sequence diagram of a modified spin-echo EPI technique for use in accordance with the MRF approach of the present disclosure, is shown. Specifically, for each TR, a selective RF excitation pulse 102 that is coordinated with a 2D phase encoding gradient pulse 104 and a 3D phase encoding gradient pulse 106 are applied to position encode the nuclear magnetic resonance (NMR) signal 108 along one direction in the slice. A series of readout gradient pulses 110 with alternating polarity are played along the readout direction to produce a series of spin-echo signals 108. Specifically, the readout gradient pulses 110 are spaced apart, and phase-encoding gradient blips 112 are played out to separately phase encode each acquired echo 108. In particular, there is a separate readout gradient pulse 110 and phase-encoding gradient blip 112 for each view of k-space that is to be acquired. In this manner, multiple views may be acquired for each excitation in the TR, to encompass either k-space segments or preferably fully sample k-space in accordance with the Nyquist criterion.

In general spin-echo EPI sequences, the flip angle, FA, values of the RF excitations are usually 90 degrees to maximize the signal to noise ratio ("SNR"). By contrast, the present disclosure employs a variable FA, $\alpha$, that may be varied according to the optimized acquisition parameters, unlike previous MRF approaches that utilize pseudorandomized parameter values.

Depending on the duration of the TR, in accordance with aspects of the present disclosure, multiple slices may be acquired during each scan. For instance, delays 114 associated with wait times used for magnetization recovery of successive phase encoding k-space lines may limit total scan times. Thus, in certain applications, these otherwise dead times may be utilized for acquisition of multiple slices to facilitate three-dimensional ("3D") data acquisition.

In the manner described, multiple acquisitions can be performed, wherein scan parameter values for each acquisition can vary from one excitation to the next. For example, fifteen acquisitions can take place in a manner described above, although other values are possible. In some aspects, TR, FA, and other parameter values may be varied in accordance with optimized trajectories. The parameters can be varied sequentially, simultaneously, or in accordance with a differential sensitivity requirement for specific parameters of interest.

Figure 2:
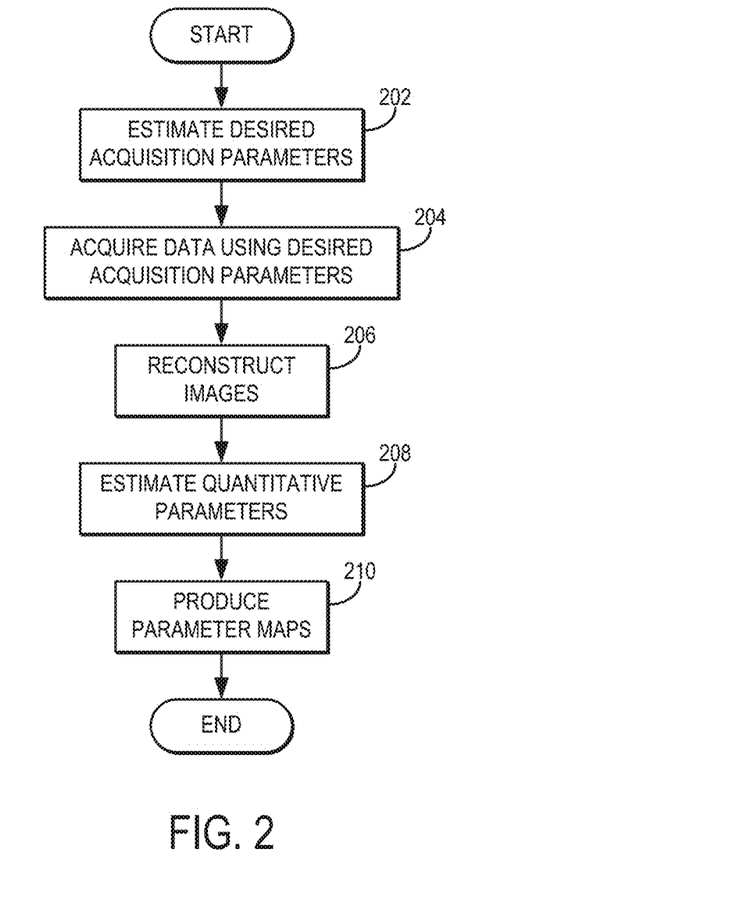
FIG. 2 is a flow chart setting for the steps of an example method for estimating quantitative parameters from data acquired using acquisition parameters that have been optimized to reduce acquisition time and produce quantitative data in an MRF application.

Referring now to FIG. 2, a flowchart is illustrated as setting forth the steps of an example method for estimating quantitative parameters (e.g., $T_1$, $T_2$, $B_0$, and proton density, $\rho$) from data acquired using acquisition parameters that have been selected reduce the number of acquisitions of, for example, a multi-echo sequence such as described above may be used to sample the quantitative parameter space to meet a desired or optimization criteria. For example, the method may begin by generating a vector, or trajectory, of acquisition parameters that has been selected, for example, to reduce the number of acquisitions necessary to sufficiently sample the quantitative parameter space using a multi-echo train sequence, such as described above, that can sample k-space in a Cartesian sampling pattern, as indicated at step 202.

By way of example, desired or optimized acquisition parameters, such as FA and TR, can be selected by providing an initial, randomly generated seed vector of the acquisition parameters to be selected. This seed vector has a length, N, and is used to simulate the signal for a range, P, of quantitative parameters. For simplicity, this example describes a $T_1$ mapping application, in which only a range, P, of $T_1$ values is simulated; however, it will be appreciated that other tissue parameters (e.g., $T_2$, proton density, off-resonance) can similarly be simulated. The seed vector and simulated quantitative parameters are used to form an N×P matrix, A. This matrix, A, can then be used to calculate a dot product matrix, $$D = A^T A \quad (1).$$

The diagonal elements of this dot product matrix, D, indicate the closeness of a match between a trajectory resulting from a given quantitative parameter (e.g., $T_1$) and itself. The diagonal elements are, therefore, equal to one. The off-diagonal elements of the dot product matrix, D, however, indicate the quality of matching between every two different elements of the matrix, A. Discriminating between $T_1$ values in the matching process requires that the dot product of a measured trajectory with the pre-computed trajectory that is stored in the dictionary be high for the correct $T_1$ value and, ideally, zero for all others. To find the vector of acquisition parameters (e.g., TRs and FAs) that yield this optimum, the following optimization problem can be utilized:

$$\min_x f(x) \text{ such that} \sum_{i \neq j} D_{ij}(x) - \lambda \sum_{i=j} D_{ij}(x); \quad (2)$$

where $f(x)$ is the function to simulate the trajectories and compute the dot product matrix, D, given a vector, x, of acquisition parameters. A penalty term, $\lambda$, is applied as well to avoid minimizing the on-diagonal elements. As one example, a constrained non-linear solver can be used to solve Eqn. (2).

Figure 3A:
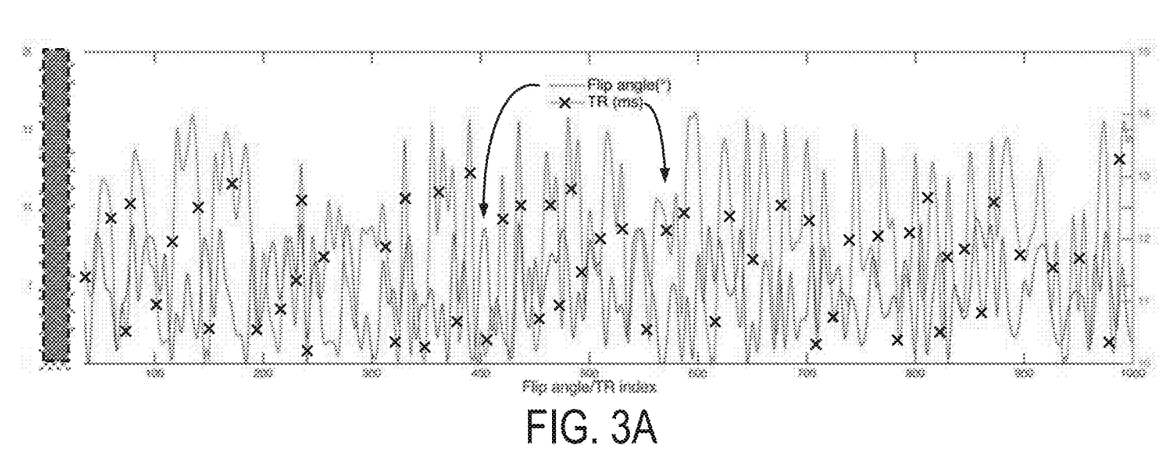
FIG. 3A is a series of graphs and dot product matrices illustrating the effects of using an optimized set of imaging parameters.
Figure 3B:
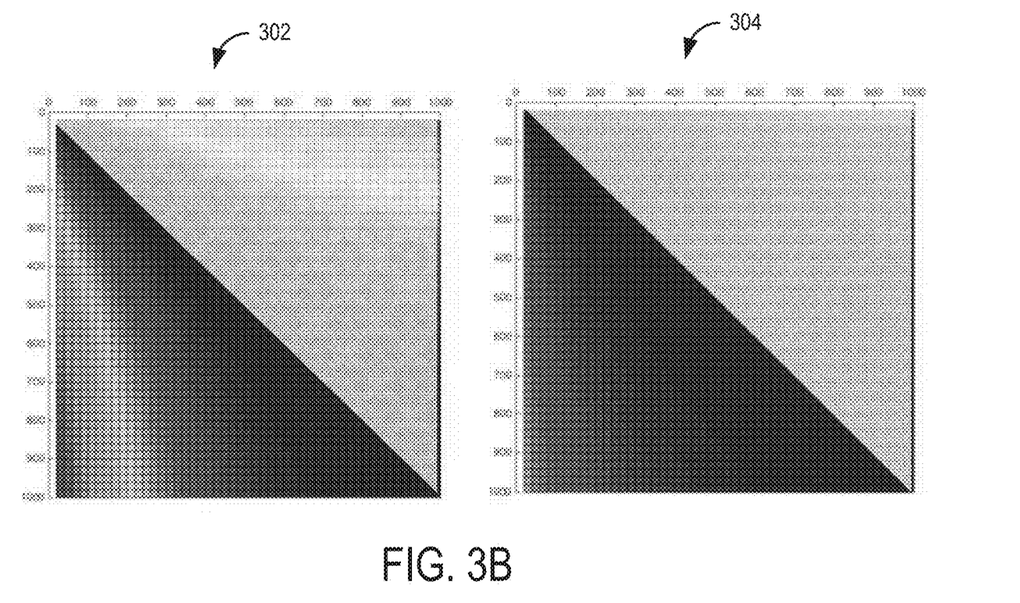
FIG. 3B is a series of graphs and dot product matrices illustrating the effects of using an optimized set of imaging parameters.
Figure 3C:
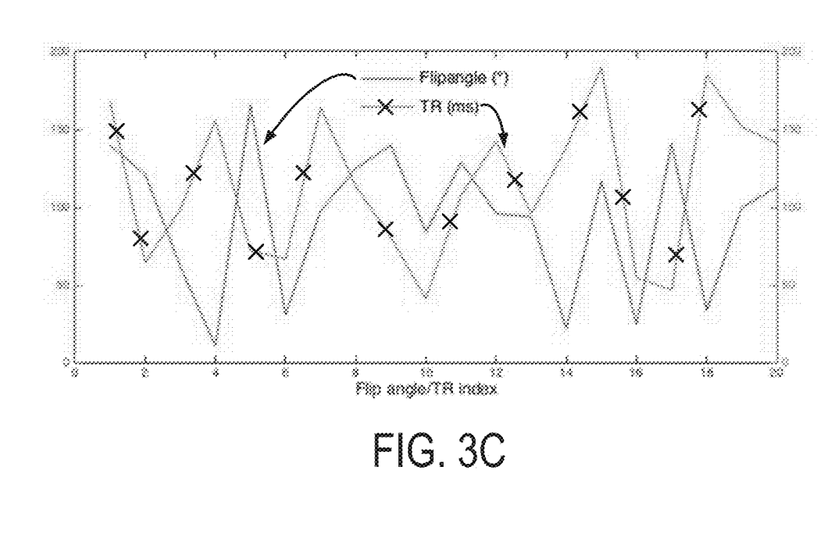
FIG. 3C is a series of graphs and dot product matrices illustrating the effects of using an optimized set of imaging parameters.
Figure 3D:
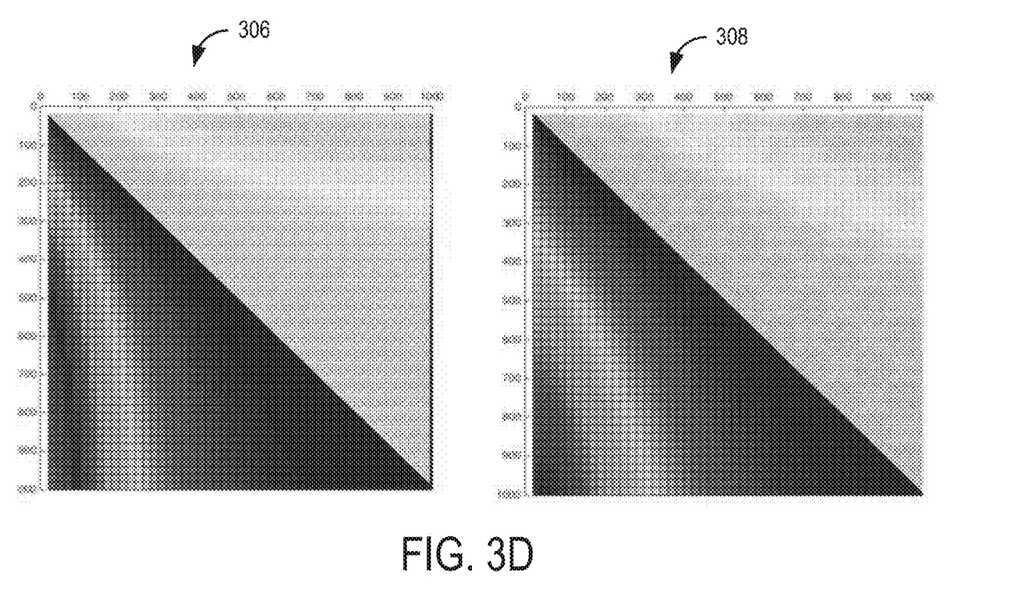
FIG. 3D is a series of graphs and dot product matrices illustrating the effects of using an optimized set of imaging parameters.

By way of example, FIG. 3A illustrates a vector of length N=1000 points of acquisition parameters FA and TR representing a non-optimized trajectory. Illustrated in FIG. 3B are the dot product matrices for this trajectory in both on-resonance 302 and 10 Hz off-resonance 304 conditions. It can be seen that for the non-optimized trajectory, in on-resonance 302 conditions, the dot product matrix is roughly diagonal, but in off-resonance 304 conditions there is hardly any selectivity which will lead to poorer matching. FIG. 3C illustrates a vector of length N=20 points representing an optimized trajectory of acquisition parameters FA and TR. As can be seen in the dot product matrices of FIG. 3D, the dot product matrix of the optimized trajectory is very diagonal both at on-resonance 306 and 10 Hz off-resonance 308 conditions.

Referring again to FIG. 2, the method for estimating quantitative parameters continues by acquiring data by directing an MRI system to perform pulse sequences using the desired acquisition parameters, as indicated at step 204. Using an EPI pulse sequence has the added benefit that k-space can be fully sampled in rapid fashion, which reduces the total number of acquisitions required overall. Reducing the total number of acquisitions not only provides a time saving measure, but also reduces the computational burden of matching the acquired data to a pre-computed dictionary because a smaller dictionary can be used with the reduced number of acquisitions. As mentioned above, although the EPI pulse sequence allows greater signal evolutions that previously MRF acquisitions, it is a discovery that these greater signal evolutions do not significantly reduce the accuracy or repeatability of the matching procedure.

Referring still to FIG. 2, the method continues by reconstructing images from the acquired data, as indicated at step 206. When an EPI sequence that sampled k-space along a Cartesian trajectory is used to acquire the data, reconstruction can be achieved using a conventional Fourier transform-based reconstruction, which introduces another reduction in the computational burden compared to conventional MRF applications that require complex reconstruction techniques to reconstruct images from data acquired using non-Cartesian trajectories.

Quantitative parameters are then estimated by matching the reconstructed images to one or more pre-computed dictionaries, as indicated at step 208. Conventional matching algorithms can be used; however, in some embodiments, an adaptive matching algorithm, such as the one described in U.S. Patent Application Ser. No. 62/025,268, which is herein incorporated by reference in its entirety, can also be used. Parameter maps can then be generated using the estimated quantitative parameters, as indicated at step 210.

As another example case, MRF in 3D at 6.5 mT is demonstrated, using an optimized set of 15 flip angles and repetition times (FA/TR), in a Cartesian acquisition of k-space with a hybrid b-SSFP-EPI sequence. A hybrid multishot b-SSFP-EPI pulse sequence with an echo-train of 4 echoes is used. The sequence is set with matrix size=64×64×5, corresponding voxel size=(2.5×3.5×10) mm³, field of view (FOV)=(125×175×50) mm³, number of averages NA=2. The minimum TR is 62 ms with 9091 Hz bandwidth. The total acquisition time is 25 min. A FA/TR trajectory of length N=15 was generated using the optimization method previously described. Lack of SNR at low magnetic field required redesigning the optimization scheme with a narrow range of larger flip angles [60-120°] and shorter TRs [62-400 ms].

The imaged phantom comprises a stack of three 10 mm thick compartments of similar volume with different T1 and T2 properties to stimulate tissues of a subject.

Figure 4:
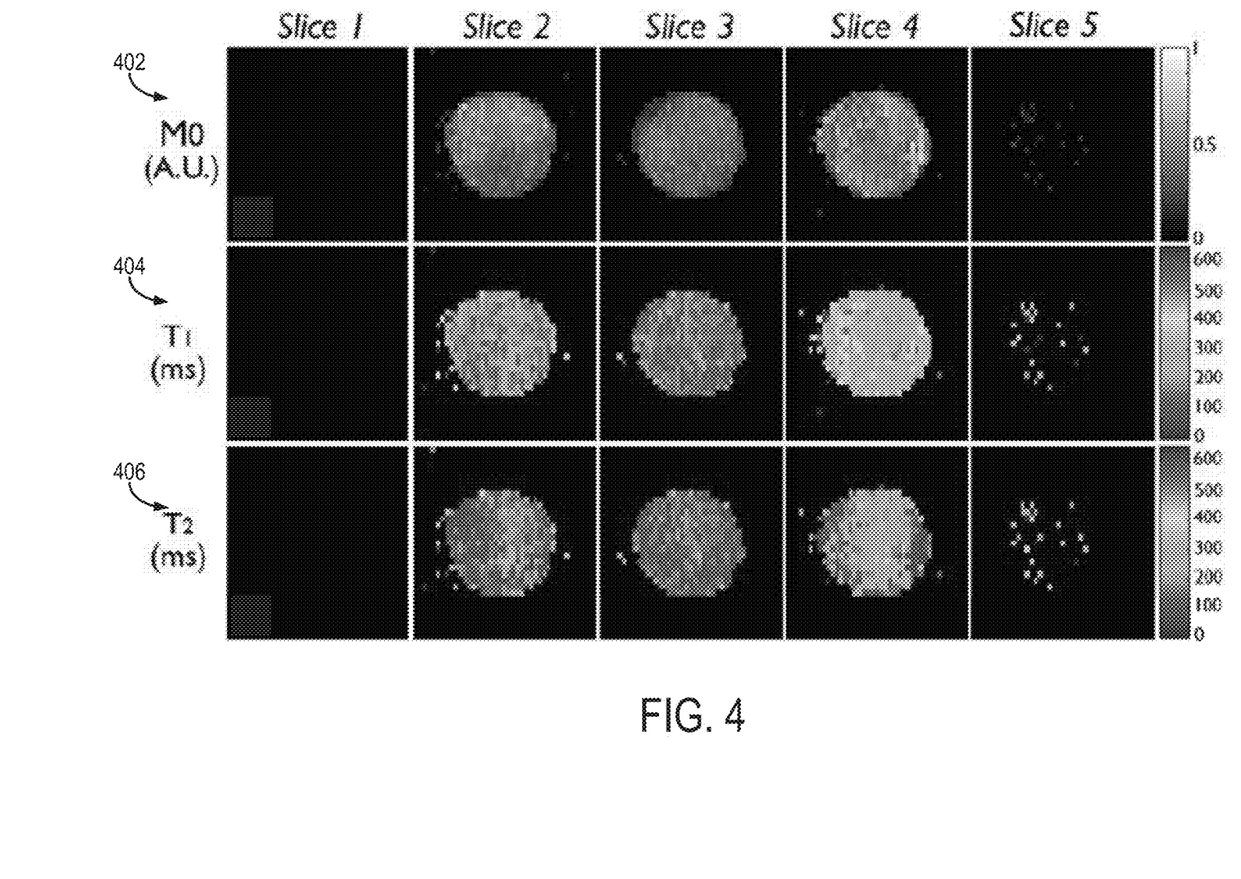
FIG. 4 illustrates examples of spin density, $T_1$, and $T_2$ maps estimated using techniques described herein.

Each image generated in the reconstructed fingerprinting set, presented in FIG. 4, reveals different information. In regions with no signal (Slice 1, Slice 5), no matched value can be found. The spin density (M0) map 402 is equivalent to traditional b-SSFP, and only subtle differences are seen between compartments. The compartment in slice 3 has the lowest T1 404 and T2 406 values, and that the compartment in slice 4 has the highest T1 404 and T2 406 values. Mean T1 404 values are 200 ms, 168 ms, and 320 ms in slices 2, 3, and 4 respectively. Mean T2 406 values are 180, 157, and 260 ms in slices 2, 3, and 4 respectively.

As this example demonstrates, 3D MR Fingerprinting at very low magnetic field with a hybrid b-SSFP-EPI sequence enables fast and robust acquisition of k-space. The optimized FA/TR strategy provides good dispersion while drastically reducing the total acquisition time. This method measures quantitative parameters in 3D, and generates several image contrasts in a single acquisition (proton density, T1, T2) in less than 30 minutes. This technique is of particular relevance at low magnetic field where SNR and contrast are tied to long acquisition times. The combination of 3D MRF with low field MRI scanners has great potential to provide clinically relevant contrast with portable low cost MR scanners.

Figure 5:
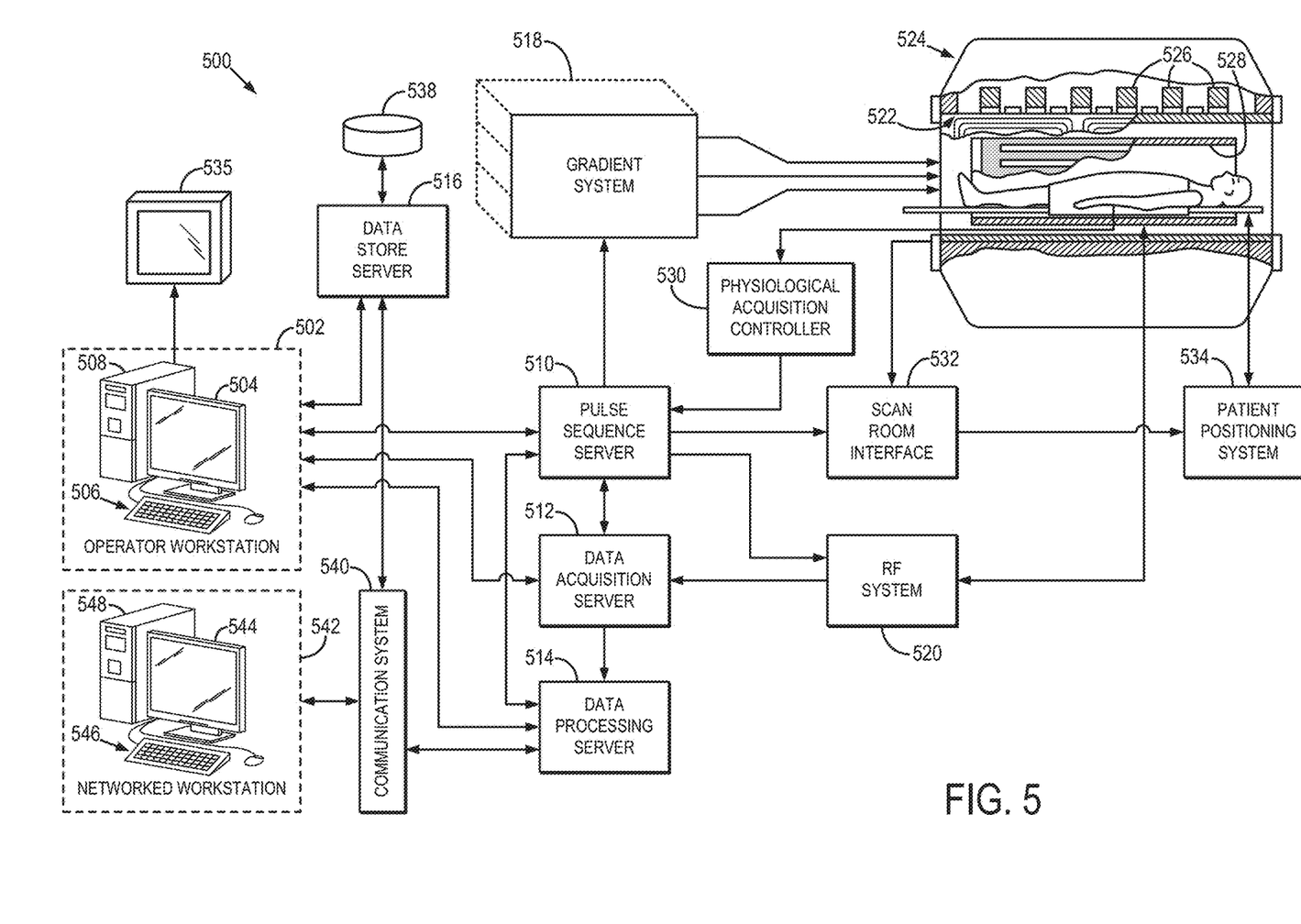
FIG. 5 is a block diagram of an example of a magnetic resonance imaging ("MRI") system.

Referring particularly now to FIG. 5, an example of a magnetic resonance imaging ("MRI") system 500, for use in accordance with the present disclosure, is illustrated. The MRI system 500 includes an operator workstation 502, which will typically include a display 504; one or more input devices 506, such as a keyboard and mouse; and a processor 508. The processor 508 may include a commercially available programmable machine running a commercially available operating system. The operator workstation 502 provides the operator interface that enables scan prescriptions to be entered into the MRI system 500. In general, the operator workstation 502 may be coupled to four servers: a pulse sequence server 510; a data acquisition server 512; a data processing server 514; and a data store server 516. The operator workstation 502 and each server 510, 512, 514, and 516 are connected to communicate with each other. For example, the servers 510, 512, 514, and 516 may be connected via a communication system 540, which may include any suitable network connection, whether wired, wireless, or a combination of both. As an example, the communication system 540 may include both proprietary or dedicated networks, as well as open networks, such as the internet.

The pulse sequence server 510 functions in response to instructions downloaded from the operator workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 628, or a separate local coil (not shown in FIG. 5), in order to perform the prescribed magnetic resonance pulse sequence. Responsive magnetic resonance signals detected by the RF coil 528, or a separate local coil (not shown in FIG. 5), are received by the RF system 520, where they are amplified, demodulated, filtered, and digitized under direction of commands produced by the pulse sequence server 510. The RF system 620 includes an RF transmitter for producing a wide variety of RF pulses used in MRI pulse sequences. The RF transmitter is responsive to the scan prescription and direction from the pulse sequence server 510 to produce RF pulses of the desired frequency, phase, and pulse amplitude waveform. The generated RF pulses may be applied to the whole-body RF coil 528 or to one or more local coils or coil arrays (not shown in FIG. 5).

The RF system 520 also includes one or more RF receiver channels. Each RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 510 also optionally receives patient data from a physiological acquisition controller 530. By way of example, the physiological acquisition controller 530 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, such that no data is lost by data overrun. In some scans, the data acquisition server 512 does little more than pass the acquired magnetic resonance data to the data processor server 514. However, in scans that require information derived from acquired magnetic resonance data to control the further performance of the scan, the data acquisition server 512 is programmed to produce such information and convey it to the pulse sequence server 510. For example, during prescans, magnetic resonance data is acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also be employed to process magnetic resonance signals used to detect the arrival of a contrast agent in a magnetic resonance angiography ("MRA") scan. By way of example, the data acquisition server 512 acquires magnetic resonance data and processes it in real-time to produce information that is used to control the scan.

The data processing server 514 receives magnetic resonance data from the data acquisition server 512 and processes it in accordance with instructions downloaded from the operator workstation 502. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 514 are conveyed back to the operator workstation 502 where they are stored. Real-time images are stored in a data base memory cache (not shown in FIG. 5), from which they may be output to operator display 512 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the operator workstation 502. The operator workstation 502 may be used by an operator to archive the images, produce films, or send the images via a network to other facilities.

The MRI system 500 may also include one or more networked workstations 542. By way of example, a networked workstation 542 may include a display 544; one or more input devices 546, such as a keyboard and mouse; and a processor 548. The networked workstation 542 may be located within the same facility as the operator workstation 502, or in a different facility, such as a different healthcare institution or clinic.

The networked workstation 542, whether within the same facility or in a different facility as the operator workstation 502, may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may exchanged between the data processing server 514 or the data store server 516 and the networked workstations 542, such that the data or images may be remotely processed by a networked workstation 542. This data may be exchanged in any suitable format, such as in accordance with the transmission control protocol ("TCP"), the internet protocol ("IP"), or other known or suitable protocols.

The basic MR systems and principles described above may be used to inform the design of other MR systems that share similar components but operate at very-different parameters. In one example, a low-field magnetic resonance imaging (LFMRI) system utilizes much of the above-described hardware, but has substantially reduced hardware requirements and a smaller hardware footprint. For example, referring to FIG. 6, a system 600 is illustrated that, instead of a 1.5 T or greater static magnetic field, utilizes a substantially smaller magnetic field. That is, in FIG. 6, as a non-limiting example, a 6.5 mT electromagnet-based scanner is illustrated. In particular, the system 600 includes a biplanar 6.5 mT electromagnet (B0) 602 that, for example, may be formed by inner B0 coils 604 and outer B0 coils 606. Biplanar gradients 608 may extend across the B0 electromagnet 602.

Figure 6:
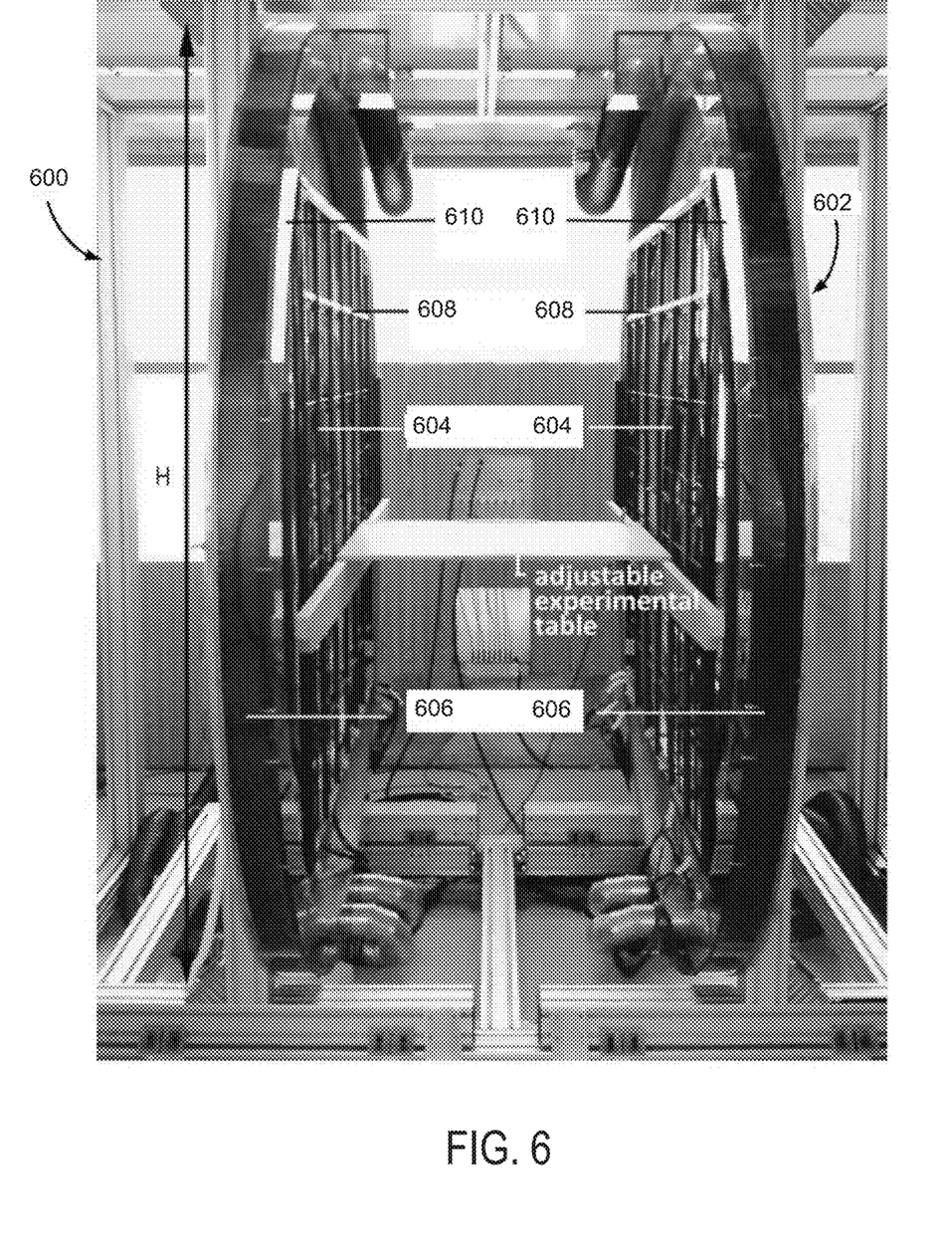
FIG. 6 is a block diagram of a low-field magnetic resonance imaging (LFMRI) system.

The LFMRI system 600 includes a magnet system in communication with a magnet assembly that includes a biplanar electromagnet 602 and gradient coils. In some implementations, the gradient coils include z gradient circular coils 608, and x and y gradient rectangular coils 610. As such, the magnet system controls the polarizing field applied to a subject, which in accordance with aspects of the present disclosure can be a low-field static magnetic field less than 10 mT, for example. Gradient waveforms produced and applied by the magnet system, as directed by the controller during a pulse sequence, excites gradient coils in an magnet assembly to produce the magnetic field gradients $G_x$, $G_y$, and $G_z$ used for position and motion encoding magnetic resonance signals.

The system 600 may be tailored for $^1$H imaging by achieving a high B0 stability, high gradient slew rates, and low overall noise. To achieve these ends, a power supply, for example, with +/−1 ppm stability over 20 min and +/−2 ppm stability over 8 h, may be used and high current shielded cables may be deployed throughout the system 600. In one non-limiting example, a power supply was adapted from a System 854T, produced by Danfysik, Taastrup, Denmark. The system 600 can operate inside a double-screened enclosure (ETS-Lindgren, St. Louis, Mo.) with a RF noise attenuation factor of 100 dB from 100 kHz to 1 GHz. In this example, the system may have a height, H, that is, as a non-limiting example, 220 cm. A cooling system 610, such as may include air-cooling ducts, may be included.

The LFMRI system may include an RF system. The RF system is connected to various RF coils to be coupled to a subject. By way of example, the RF coils may be in the form of a solenoid. In a prescribed magnetic resonance pulse sequence, a wide variety of waveforms may be generated by the RF system, as directed by the controller. The waveforms may then be amplified and transmitted to the RF coils via one or more RF transmit channels. As such, the RF system may include an RF transmitter responsive to the scan prescription to produce RF pulses of the desired frequency, phase, and pulse amplitude waveform. Each RF transmit channel may include an RF amplifier that amplifies signals produced by the RF system.

Magnetic resonance signals induced in the RF coils may then be amplified, demodulated, filtered, and digitized by the RF system before processing. As such, the RF system also includes an RF receiver for receiving induced signals by way of one or more RF receiver channels. Each RF receiver channel may include an RF preamplifier that amplifies the magnetic resonance signal received by the RF coils to which it is connected. In some implementations, the same channels may be utilized for the RF transmit channels and RF receiver channels. As such, various switching components may be utilized to modify the mode of operation from transmitting to receiving RF signals. By way of example, the RF transmitter and RF receiver may be configured to operate in a frequency range between 1 kHz and 500 MHz, although other frequencies may also be possible.

In accordance with aspects of the present disclosure, the LFMRI system 600 also includes a driver system connected to a driver, for inducing vibrations in an imaged subject during a magnetic resonance pulse sequence. The driver may be an acoustic driver, a pneumatic driver, a piezoelectric driver, or an electromechanical transducer. The driver may be configured to produce steady-state shear or transverse waves with frequencies in a range between 50 to 500 Hz, although other frequencies may be possible.

The LFMRI system 600 also includes a controller, in communication with the each of the above systems, and configured to control the operation of the LFMRI system 600. The controller may include at least one workstation that may be coupled to various servers (not shown in FIG. 6), including a pulse sequence server, a data acquisition server, a data processing server, and a data store server, as described.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for acquiring magnetic resonance fingerprinting (MRF) data from a subject using a magnetic resonance imaging (MRI) system, the method including steps comprising:
   a) selecting a pulse sequence to perform that samples k-space in a Cartesian acquisition pattern by acquiring an echo train;
   b) determining acquisition parameters for the pulse sequence by performing an iterative minimization, wherein the acquisition parameters include at least one of repetition time (TR) or flip angle (FA), selected to control a total acquisition time required to perform the pulse sequence;
   c) directing a magnetic resonance imaging (MRI) system to acquire 3-dimensional (3D) magnetic resonance fingerprinting (MRF) data from the subject by performing the pulse sequence;
   d) directing the MRI system to repeat step c) using varied scan parameters to acquire sets of the 3D MRF data using differing scan parameters;

e) estimating quantitative tissue properties of the subject by comparing the sets of the 3D MRF data using differing scan parameters to a database; and f) generate at least one image of the subject indicating the quantitative tissue properties.

2. The method of claim 1, wherein step d) includes using a variable FA, α, that is varied according to the acquisition parameters for each repetition of step c) to acquire the sets of the 3D MRF data using differing scan parameters.

3. The method of claim 1, wherein step b) includes providing an initial, randomly generated seed vector of the acquisition parameters.

4. The method of claim 3, wherein the seed vector has a length including flip angles (FA) and repetition times (TR) for a k-space trajectory and is used to simulate a signal for a range of quantitative parameters, wherein the range of the simulated signals is less than a range of measured quantitative parameters.

5. The method of claim 4, the quantitative parameters include at least one of $T_1$ values, $T_2$ values, proton density values, or off-resonance.

6. The method of claim 4, wherein the seed vector and simulated quantitative parameters are used to form a matrix, A.

7. The method of claim 6, wherein the matrix, A, is used to calculate a dot product matrix having off-diagonal elements indicating a quality of matching between different elements of the matrix, A.

8. The method of claim 7, wherein step b) includes performing an optimization process according to:

$$\min_x f(x) \text{ such that} \sum_{i \neq j} D_{ij}(x) - \lambda \sum_{i=j} D_{ij}(x) \qquad (5)$$

where $f(x)$ is a function that simulates k-space trajectories using selected acquisition parameters and computes the dot product matrix given a vector, x, of the selected acquisition parameters and λ is a penalty term applied to control against minimizing on-diagonal elements in the dot product matrix.

9. The method of claim 1, wherein the varied scan parameters include TR and FA.

10. The method of claim 1, wherein the pulse sequence includes a 3D balanced-echo planar imaging (b-EPI) pulse sequence.

11. The method of claim 10, wherein the pulse sequence includes balanced stead state free precession (b-SSFP) EPI pulse sequence.

12. The method of claim 1, wherein step c) includes averaging data acquired from a common echo train.

13. The method of claim 1, wherein the quantitative tissue properties include proton density, ρ, T1, or T2.

14. A magnetic resonance imaging (MRI) system, comprising:
a magnet system configured to generate a static magnetic field about at least a volume of interest (VOI) of a subject arranged in the MRI system;
at least one gradient coil configured to establish at least one magnetic gradient field with respect to the static magnetic field;
a radio frequency (RF) system configured to deliver excitation pulses to a subject;
and a computer system programmed to:
determine acquisition parameters by performing an iterative minimization, wherein the acquisition parameters include at least one of repetition time (TR) or flip angle (FA), selected to minimize one of a total acquisition time and a number of repetitions of a pulse sequence that samples k-space in a Cartesian acquisition pattern by acquiring an echo train;
control the at least one gradient coil and the RF system to perform the pulse sequence a plurality of times using varied scan parameters;
acquire magnetic resonance fingerprinting (MRF) data corresponding to signals from the subject excited by the pulse sequence;
estimate quantitative tissue properties of the subject by comparing the MRF data to a database; and
reconstruct, from the MRF data, at least one image of the subject indicating the estimated quantitative tissue properties.

15. The system of claim 14, wherein the static magnetic field is less than 10 mT.

16. The system of claim 14, wherein the computer system is further programmed to control the at least one gradient coil and the RF system to perform the pulse sequence a plurality of times includes using a variable FA, α, that is varied according to the acquisition parameters for each repetition to acquire the of MRF data using differing scan parameters.

17. The system of claim 14, wherein the pulse sequence includes a 3D balanced-echo planar imaging (b-EPI) pulse sequence.

18. The method of claim 17, wherein the pulse sequence includes balanced stead state free precession (b-SSFP) EPI pulse sequence.

19. The method of claim 14, wherein the computer system is further programmed to utilize delays in the pulse sequence provided for magnetization recovery of successive phase encoding k-space lines for acquisition of multiple slices to acquire three-dimensional (3D) MRF data.

20. The method of claim 14, wherein the quantitative tissue properties include proton density, ρ, T1, or T2.

21. The method of claim 14, wherein performing the iterative minimization begins by providing an initial seed vector of the acquisition parameters.

* * * * *

UNITED STATES PATENT AND TRADEMARK OFFICE
CERTIFICATE OF CORRECTION

| | |
|---|---|
| PATENT NO. | : 10,598,750 B2 |
| APPLICATION NO. | : 15/088353 |
| DATED | : March 24, 2020 |
| INVENTOR(S) | : Matthew S. Rosen et al. |

It is certified that error appears in the above-identified patent and that said Letters Patent is hereby corrected as shown below:

In the Specification

Column 1, Line 17, "W81XWH-11-2-076" should be --W81XWH-11-2-0076--.

Signed and Sealed this
Thirty-first Day of May, 2022

*Katherine Kelly Vidal*

Katherine Kelly Vidal
*Director of the United States Patent and Trademark Office*